US011422168B2

(12) United States Patent
Clayton

(10) Patent No.: US 11,422,168 B2
(45) Date of Patent: Aug. 23, 2022

(54) ON-CHIP, LOW-VOLTAGE, CURRENT SENSING CIRCUIT

(71) Applicant: NXP USA, Inc., Austin, TX (US)

(72) Inventor: Felipe Ricardo Clayton, Campinas (BR)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 17/022,929

(22) Filed: Sep. 16, 2020

(65) Prior Publication Data
US 2022/0082595 A1 Mar. 17, 2022

(51) Int. Cl.
*G01R 19/165* (2006.01)
*G01R 19/10* (2006.01)
*H03F 3/04* (2006.01)
*H03K 17/687* (2006.01)

(52) U.S. Cl.
CPC ....... *G01R 19/16571* (2013.01); *G01R 19/10* (2013.01); *H03F 3/04* (2013.01); *H03K 17/6871* (2013.01)

(58) Field of Classification Search
None
See application file for complete search history.

(56) References Cited

U.S. PATENT DOCUMENTS

| | | | |
|---|---|---|---|
| 4,885,477 A | 12/1989 | Bird et al. | |
| 6,377,034 B1 | 4/2002 | Ivanov et al. | |
| 6,486,740 B1 | 11/2002 | Baldwin et al. | |
| 6,785,826 B1 | 8/2004 | Durham et al. | |
| 7,800,171 B2 | 9/2010 | Von Borcke et al. | |
| 9,092,043 B2 | 7/2015 | Nascimento | |
| 9,106,226 B2 | 8/2015 | Shuvalov | |
| 9,217,780 B2 | 12/2015 | Bashar | |
| 9,444,414 B2 | 9/2016 | Peluso | |
| 9,703,991 B2 * | 7/2017 | Kultran | G06G 7/163 |
| 9,983,602 B2 * | 5/2018 | Raja | G05F 1/10 |
| 10,705,125 B1 * | 7/2020 | Schapendonk | G01R 19/16552 |
| 2004/0008016 A1 * | 1/2004 | Sutardja | H02M 3/157 323/283 |
| 2009/0289721 A1 * | 11/2009 | Rajendran | H03F 3/195 330/301 |
| 2011/0093733 A1 | 4/2011 | Kruglick | |
| 2016/0124030 A1 | 5/2016 | Zhang et al. | |

(Continued)

OTHER PUBLICATIONS

Danchiv, Andrei et al.; "An Area Efficient Low Offset Autozero Amplifier Design"; Institute of Electrical and Electronics Engineers; 2009; pp. 140-143.

(Continued)

*Primary Examiner* — Thomas J. Hiltunen
*Assistant Examiner* — Khareem E Almo

(57) ABSTRACT

An on-chip low-voltage current sensing circuit for measuring current in an integrated circuit (IC). In one embodiment, an IC formed on a substrate, which includes a plurality of subcircuits, and a plurality of sensing circuits coupled to the plurality of subcircuits, respectively. The plurality of sensing circuits are configured to generate a plurality of currents, respectively, that are proportional to a plurality of load currents, respectively, consumed by the plurality of subcircuits, respectively, during operation thereof. A circuit is coupled to the plurality of sensing circuits and configured to generate a signal based on an aggregate of the plurality of currents.

20 Claims, 5 Drawing Sheets

(56) References Cited

U.S. PATENT DOCUMENTS

| | | |
|---|---|---|
| 2016/0266175 A1 | 9/2016 | Nizza et al. |
| 2017/0075397 A1 | 3/2017 | Saeidi et al. |
| 2019/0103801 A1 | 4/2019 | Venkataraman et al. |
| 2019/0384372 A1* | 12/2019 | Kronmueller ......... G06F 1/3209 |

OTHER PUBLICATIONS

Park, Jungeui, et al.; "Current-Sensing Technique for Current-Mode DC-DC Buck Converter with Offset-Voltage Compensation"; Department of Electrical and Computer Engineering; University of Seoul; IEEE Asia Pacific Conference on Circuits and Systems (APCCAS); 2008; pp. 1704-1707.

* cited by examiner

ON-CHIP, LOW-VOLTAGE, CURRENT SENSING CIRCUIT

BACKGROUND

Current measuring circuits formed on integrated circuits (IC) can measure load currents or currents consumed by IC subcircuit blocks. A control system manages the subcircuits based on the measured load currents. For example, a control system may compare a load current for a subcircuit to a threshold value. If the load current exceeds the threshold value, the control system can reduce the load current by reducing the speed at which the subcircuit operates, deactivating the subcircuit, etc.

BRIEF DESCRIPTION OF THE DRAWINGS

The present technology may be better understood, and its numerous objects, features, and advantages made apparent to those skilled in the art by referencing the accompanying drawings.

The use of the same reference symbols in different drawings indicates similar or identical items.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
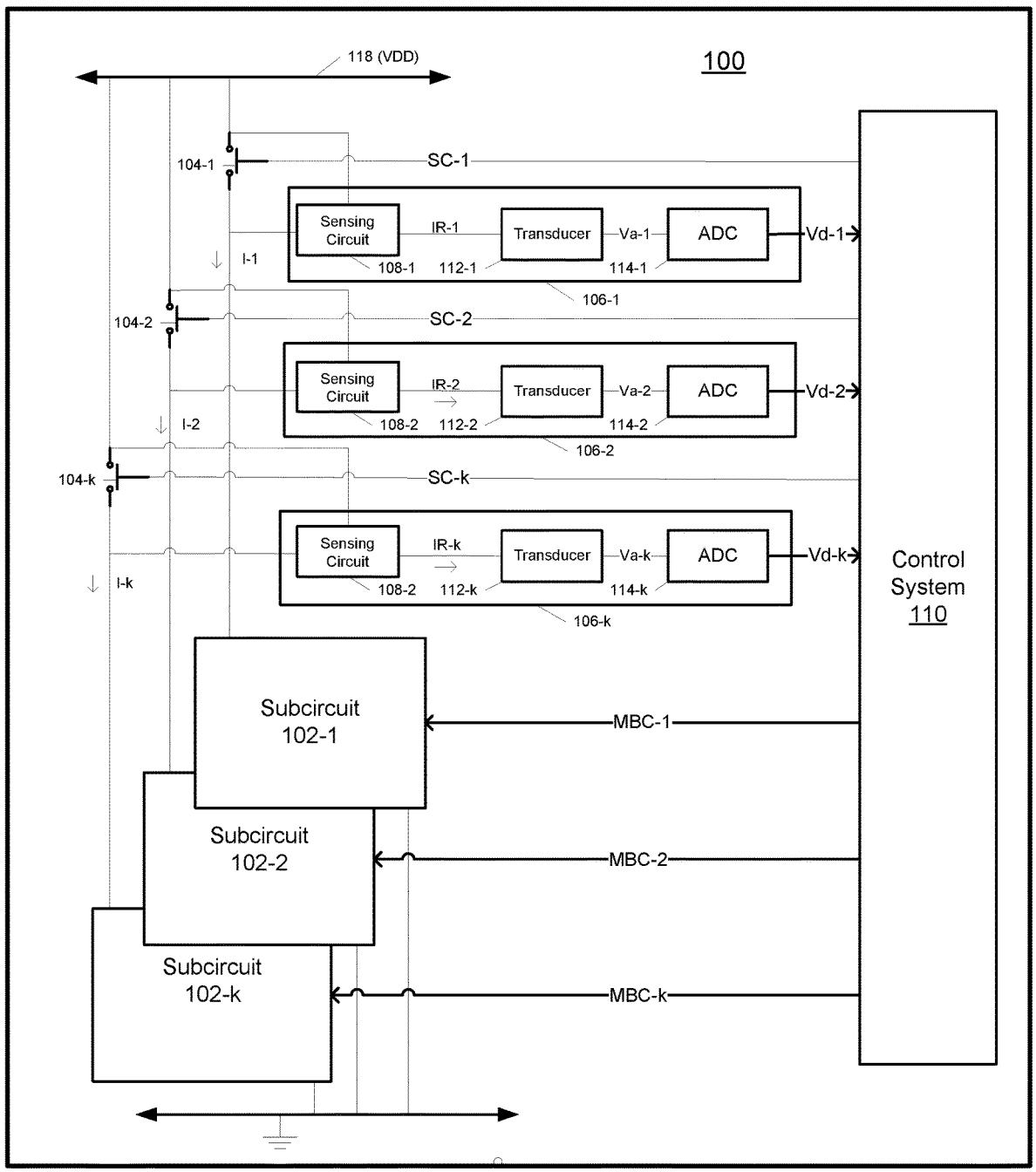
FIG. 1A is a block diagram that illustrates an example IC that includes current measurement circuits.

FIG. 1A is a block diagram of an IC 100 that contains subcircuits 102, power switches 104, current measurement circuits 106, and a control system 110. Switches 104 selectively couple respective subcircuits 102 to a conductor 118 that provides a supply voltage VDD. Current measurement circuits 106 measure load currents I (e.g., I-1) that are passed to respective subcircuits 102 (e.g., subcircuit 102-1). As will be more fully described, control system 110 manages power switches 104 and subcircuits 102 based on measured load currents I.

Control system 110 controls power switches 104 via respective switch control (SC) signals. For example, control system 110 can activate or close power switch 104-1 by asserting SC-1, or control system 110 can deactivate or open power switch 104-1 by deasserting SC-1. When supply VDD is available, each activated switch 104 provides supply voltage Vdd and accordingly conducts load current I to its corresponding subcircuit 102. Control system 110 also manages subcircuits 102 via respective multibit control MBC signals. For example, control system 110 can activate or deactivate subcircuit 102-1 (e.g., a digital signal processor or DSP) via MBC-1. When deactivated, a subcircuit should not consume current. In addition control system 110 can control operational aspects of subcircuits 102 that affect current consumption. For example, control system 110 can increase or decrease the speed at which subcircuit 102-1 operates via MBC-1. Control system 110 may open a switch 104 while its corresponding subcircuit 102 is disabled to eliminate any current leakage.

Each current measurement circuit 106 in FIG. 1 includes a current sensing circuit 108 that generates a replica current IR, which is proportional to its corresponding load current I. Each current measurement circuit 106 also includes a transducer 112 and an analog-to-digital converter (ADC) 114. Each transducer 112 converts the replica current IR it receives into an analog voltage Va with a magnitude that is proportional to IR. Each ADC 114 converts the analog voltage Va it receives into an equivalent multibit digital value Vd. Control system 110 receives the digital values Vd from the ADCs 114.

Control system uses multibit digital values Vd to control switches 104 and manage subcircuits 102. For example, control system 110 may compare a predetermined value Threshold-1 to Vd-1, which is proportional to load current I-1 passed to subcircuit 102-1. If Vd-1 exceeds Threshold-1, then control system 110 may take steps to reduce load current I-1 consumed by subcircuit 102-1. For example control system 110 may reduce the speed at which subcircuit 102-1 operates, shut down the subcircuit 102-1, etc., via multibit control signal MBC-1. In addition or alternatively, control system 110 may deactivate corresponding switch 104-1 if Vd exceeds Threshold-1. If Threshold-1 exceeds Vd-1, control system 110 may take steps to increase load current I-1 such as, for example, increasing the operating speed of subcircuit 102-1. Control system 110 may sum digital values Vd provided by all of ADCs 114, and compare the summed value to an upper limit imposed by a customer (e.g., a device manufacturer that incorporates the IC 100 into a device). The upper limit (e.g., make the upper limit a condition of using the IC) is set to prevent IC 100 from overheating and/or malfunctioning. If the summed value approaches the upper limit, then control system 110 may take steps to reduce overall current consumption by subcircuits 102 such as by reducing the operating speed of one or more subcircuits 102, shutting down one or more subcircuits 102, deactivating one or more switches 104, etc.

Figure 1B:
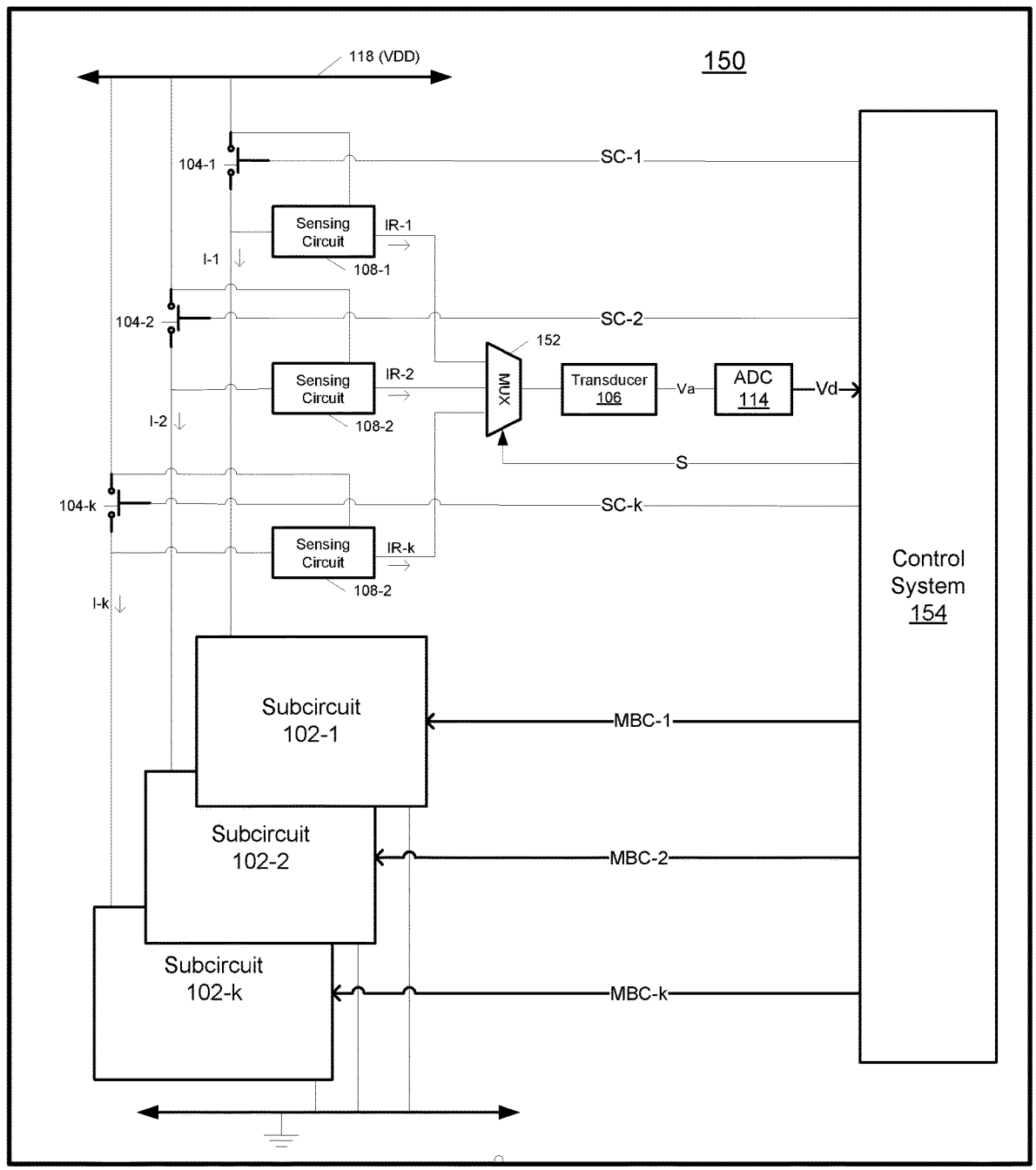
FIG. 1B is a block diagram that illustrates an another IC that includes current measurement circuits.

Transducers 112 and ADCs 114 occupy substantial area of the substrate upon which IC 100 is formed. In addition transducers 112 and ADCs 114 consume power, which can be a problem if IC is contained in a portable device that is powered by a battery. FIG. 1B is a block diagram of an IC 150 that mitigates these problems. IC 150 is similar to IC 100 shown in FIG. 1A, but with a single transducer 106 and a single ADC 114. In addition, IC 150 includes a multiplexer 152 controlled by control system 154 via selector signal S issued. Multiplexer 152 is configured to receive replica currents IR-1-IR-k from respective sensing circuits 108. Based upon the selector signal S, multiplexer 152 couples the output of one of the sensing circuits 108 to transducer 106. Transducer 106 converts the replica current IR it receives from multiplexer 152 into an analog voltage Va equivalent. ADC 100 converts Va into a multibit digital value Vd for subsequent processing by control system 154. Sensing circuits 108 and subcircuits 102 are managed by control system 154 in response to processing digital value Vd. Compared to IC 100, IC 150 lacks multiple transducers 106 and ADCs 114. However reductions in substrate area and power obtained by reducing the number of transducers 106 and ADCs 114 is offset by the addition of multiplexer 152. In addition, control system 154 is more complex than control system 110 since control system 154 must coordinate selection signal S with the appropriate processing of multibit digital signal Vd in order to accurately manage switches 104 and subcircuits 102. Importantly, both control systems 110 and 154 receive and process multibit digital signals Vd that represent respective load currents.

Figure 2:
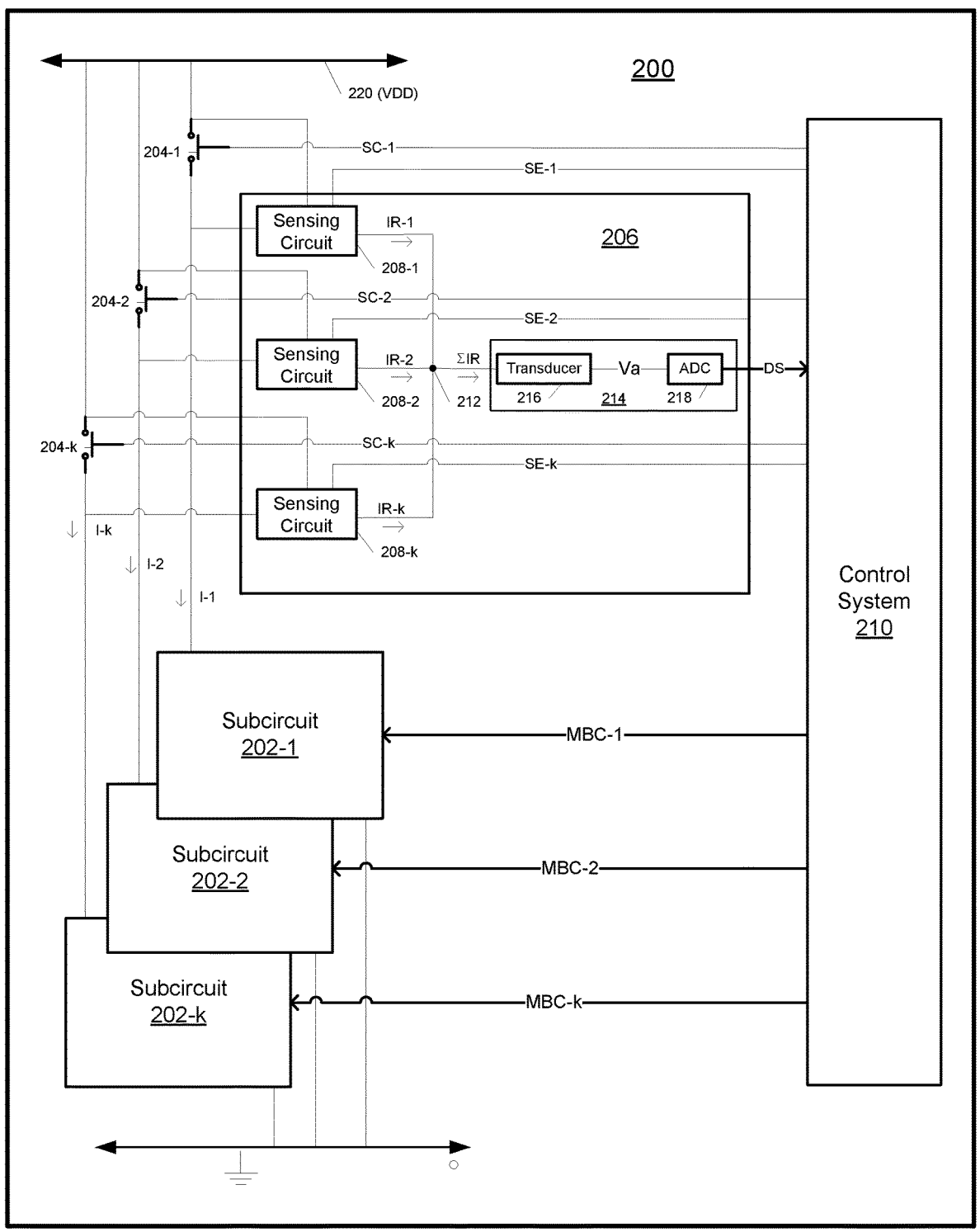
FIG. 2 is block diagram illustrating an example IC that includes current measurement circuit.

FIG. 2 is a block diagram showing relevant components of an IC 200 (e.g., a microcontroller, microprocessor, system on a chip, etc.) employing an on-chip current measurement circuit which addresses problems described above. IC 200 contains k subcircuits 202 (e.g., CPUs, GPUs, DSP cores, memory, I/O ports, etc.) with distinct size, structure and function. IC 200 also includes power switches 204, current measurement circuit 206, control system 210, and a conductor or rail 220 that provides supply voltage VDD. FIG. 2 shows an equal number of subcircuits 202, power switches 204, and current sensing circuits 208. In an alternative embodiment, the number of subcircuits 202 may differ from the number of power switches 204 or current sensing circuits 208.

Switches 204 selectively couple respective subcircuits 202 to supply voltage VDD. FIG. 2 shows one supply rail 220. In an alternative embodiments, switches 204 may selectively couple subcircuits 202 to respective rails that provide supply voltages of equal or different magnitudes. In yet another embodiment a first group of switches 204 may selectively couple one group of subcircuits 202 to a first rail that provides a first supply voltage, while a second set of switches 204 may selectively couple another group of subcircuits 202 to a second rail that provides a second supply voltage, and so on.

Control system 210 can manage subcircuits 202, power switches 204, and current measurement circuit 206. Control system 210 may take form in a processor and a memory that stores instructions executable by the processor. In this embodiment control system 210 can process multibit digital signal DS received from current measurement circuit 206 in accordance with instructions stored in the memory. As will be more fully described below, multibit digital signal DS may represent one load current or a summation of two or more load currents. Alternative control systems 210 may include several subsystems (e.g., a multi core (e.g., CPU) device, finite state machines, etc.) that communicate with each. For example, control system 210 may include a CPU and finite state machines in data communication with the CPU. The CPU can generate control values based on processing DS in accordance with instructions stored in memory. The finite state machines can manage subcircuits 202, power switches 204, and current measurement circuit 206 based on the control values received from the CPU. Other embodiments of control system 210 are contemplated.

Current measurement circuit 206 includes k current sensing circuits 208, each of which generates a replica current IR (e.g., IR-1) that is proportional to load current I (e.g., I-1) passed to a corresponding subcircuit 202 (e.g., subcircuit 202-1). Some of the subcircuits 202 may draw substantially more load current than other subcircuits 202. Each current sensing circuit 208 should be designed with a capability to sense the largest load currents drawn by its corresponding subcircuit 202. If the range in which a current sensing circuit can sense current is too small, the current sensing circuit's ability to accurately measure its corresponding load current may be compromised. To illustrate, if the current sensing range of a current sensing circuit 208 is limited to X mA, and the load current I is X+10 mA, current sensing circuit 208 will generate a replica current IR that is proportional to X mA, not X+10 mA (in other words, the current sense output will saturate). In one embodiment, sensing circuits 208 have equal current sensing ranges, each large enough to cover the maximum load current drawn by any of subcircuits 202. In an alternative embodiment, several sensing circuits 208 may have different current sensing ranges. For example, a first group of one or more of sensing circuits 208 may have a current sensing range that is greater than that for a second group of one or more sensing circuits. The current sensing range of one or more, or all of sensing circuits 208 may be static, or the current sensing range of one or more, or all of sensing circuits 208 can be adjusted during operation of IC 200.

Control system 210 controls power switches 204 via respective SC signals. For example, control system 210 can individually activate any one of switches 204 by asserting the appropriate SC signal, or control system 210 can individually deactivate any one of the switches 204 by deasserting the appropriate SC signal. Control circuit 210 can activate a subgroup of switches 204 by concurrently asserting the appropriate SC signals, or control system 210 can deactivate a subgroup of switches 204 by concurrently deasserting the appropriate SC signals. Control system 210 can activate all switches 204 by concurrently asserting all SC signals, and control system 210 can deactivate all switches 204 by concurrently deasserting all SC signals. Each switch 204 when activated passes load current I to its corresponding subcircuit 202. Control system 210 may deactivate a switch 204 while its corresponding subcircuit 202 is disabled in order to reduce or eliminate any leakage current therefrom. A subcircuit 202 may be disabled while its corresponding switch 204 is activated so that the subcircuit can be promptly restarted and resume its function in a short amount of time. And of course, control system 210 may concurrently activate corresponding subcircuits 202 and switches 204.

In addition to controlling switches 204, control system 210 can manage subcircuits 202 via respective multibit control MBC signals. For example, control system 210 can individually enable or disable each of the subcircuits 202, concurrently enable or disable a group of subcircuits 202, or concurrently enable or disable all subcircuits 202. When disabled, current may leak from a subcircuit 202. Control system 210 can individually control operational parameters or behaviors, such as operating speed, of subcircuits 202 via respective MBC signals. For ease of illustration FIG. 2 includes individual paths for passing MBC signals from control system 210 to respective subcircuits 202. In an alternative embodiment, a common data bus can be used to pass MBC signals between the control system 210 and subcircuits 202. In another embodiment, control system 210 can generate an interrupt values based on DS. The interrupt values can be delivered to subcircuits 202, which take the appropriate actions in response to receiving interrupt values.

Control system 210 controls current sensing circuits 208 via sense enable SE signals. In an alternative embodiment, current sensing circuits are controlled by the same switch control SC signals that control switches 204. However, the remainder of this description will presume that current sensing circuits 208 are controlled by respective sense enable SE signals. When activated by an asserted sense enable signal SE, each current sensing circuit 208 is configured to generate a replica current IR, which is proportional to the load current I passed by its corresponding switch 204. Replica current IR should be a small fraction of its corresponding load current I in order to reduce power consumption. Replica currents IR can be summed at node 212 to produce a summed current ΣIR. Current measurement circuit 206 includes a conversion circuit 214 for converting summed current ΣIR into multibit digital equivalent DS. In the embodiment shown in FIG. 2, conversion circuit 214 includes a transducer 216 and an analog-to-digital converter (ADC) 218, it being understood that conversion circuit 214 may take other forms (e.g., current controlled oscillator and digital timer, trans-impedance amplifier or resistor plus an ADC, etc). Transducer 216 converts summed current ΣIR into an analog voltage signal Va with a magnitude that is proportional to the magnitude of DR. ADC 218 converts the analog voltage signal Va into a corresponding multibit digital value DS. Control system 210 receives and processes DS from ADC 218.

Transducer 216's replica current capability limits the effective IR output range of the sensing circuits 208. The IR limit of each current sensing circuit 208's range should be compatible with the capability of transducer 216 to detect replica current. If not, the transducer's ability to generate an accurate analog voltage Va representation of the replica current, may be compromised. To illustrate, if the replica current capability of transducer 216 is limited to X mA, and the replica current IR produced by a sensing circuit 208 is X+10 mA, transducer 216 will generate an analog voltage Va that is proportional to X mA, not X+10 mA. In one embodiment, sensing circuits 208 should be designed so that the limit of each of their replica current output ranges is compatible with the replica current capability of transducer 216. In an alternative embodiment, sensing circuits 208 in a group of two or more may designed so that the limits of their replica current output ranges when added together (i.e., ΣIR limits), is compatible with the replica current capability of transducers 216.

Only one transducer 216 and one ADC 218 is employed in FIG. 2. In contrast, FIG. 1A shows k transducers 112 and k ADCs 114. Assuming the transducers and ADCs of FIG. 1 are the same size as transducer 216 and ADC 214, the substrate area occupied by conversion circuit 214 in IC 200 should be less than the substrate area collectively occupied by transducers 112 and ADCs 114 in IC 100. Further, the amount of power dissipated by transducer 216 and 218, should be less than the power dissipated by transducers 112 and ADCs 114 of IC 100. In addition, conversion circuit 214 lacks multiplexer 152 shown in FIG. 1B. Also, multibit digital signal DS may represent one load current or a summation of two or more load currents. In contrast digital values Vd represent only load currents passed to respective subcircuits 102.

Control system 210 can monitor current, and thus power, consumed by subcircuits 202, either individually or collectively. For example, control system 210 may monitor current consumed by subcircuit 202-1 via enabled sensing circuit 208-1, while some or all switches 204 and some or all subcircuits 202 are activated by control system 210. With only sensing circuit 208-1 enabled ΣI=IR-1, and DS represents IR-1, which in turn is proportional to I-1. Control system 210 may compare a predetermined value Threshold-1 to DS. If DS exceeds Threshold-1, control system 210 can adjust operational aspects of subcircuit 202-1 to reduce its current consumption. For example, control system 210 may reduce the operating speed of subcircuit 202-1 via multibit signal MBC-1 until DS is less than Threshold-1. Lowering the operating speed of a subcircuit 202 can reduce the current, and thus power, consumed by the subcircuit 202. Alternatively control system 210 may disable subcircuit 202-1 in response to comparing DS to Threshold-1. In addition or alternatively, control system 210 may deactivate corresponding switch 204-1 if DS exceeds Threshold-1. Conversely if Threshold-1 exceeds DS, control system 210 may increase load current I-1, for example, by increasing the operating speed of subcircuit 202-1 until DS equals Threshold-1. Other subcircuits 202 can be individually monitored in similar fashion. For example, control system 210 may disable sensing circuit 208-1, and enable sensing circuit 208-2 while some or all switches 204 and subcircuits 202 are activated. In this configuration ΣI=IR-2, and DS represents IR-2, which in turn is proportional to I-2. Control system 210 may compare a predetermined value Threshold-2 to DS, where Threshold-2 is the same as or different from Threshold-1. If DS exceeds Threshold-2, control system 210 can adjust operational aspects of subcircuit 202-2 via multibit signal MBC-2. For example, control system 210 may reduce the operating speed of subcircuit 202-2 until the load current I-2 consumed by subcircuit 202-2 is less than Threshold-2. Or control system 210 may disable subcircuit 202-2. In addition or alternatively, control system 210 may deactivate corresponding switch 204-2 if DS exceeds Threshold-2. If Threshold-2 exceeds DS, control system 210 may increase load current I-2 consumed by subcircuit 202-2 by increasing the operating speed of subcircuit 202-2 via MBC-2 until DS equals Threshold-2.

Control system 210 may monitor groups of subcircuits 202. For example, control system 210 may concurrently activate all switches 204 and sensing circuits 208, while enabling all subcircuits 202. In this configuration, ΣIR equals the sum of all replica currents IR-1-IR-k which in turn corresponds to a sum of load currents I-1-I-k. Control system 210 may compare a predetermined value Threshold-all to DS. If DS exceeds Threshold-all, then control system 210 control system 210 can adjust operational aspects of one or more of subcircuits 202 via respective one or more of multibit control signals MBC-1-MBC-k to reduce total current consumption. For example, control system 210 may lower the operating speed of one or more of the subcircuits 202 until DS is less than Threshold-all. In addition or alternatively, control system 210 may deactivate one or more switches 204, or disable one or more subcircuits until DS is less than Threshold-all. If Threshold-all exceeds DS, the control system 210 may increase the total load current consumed by subcircuits 202-1-202-k by adjusting one or more of the multibit control signals MBC-1-MBC-k.

A subgroup of subcircuits 202 can be monitored in similar fashion. For example, control system 210 can monitor current consumed by subcircuits 202-1 and 202-2 via activated sensing circuits 208-1 and 208-2, while some or all switches 204 are activated, and while some or all remaining subcircuits 202 are enabled. In one embodiment, sensing circuits 208-1 and 208-2 may have the same current sensing ranges and the same IR output limits. In another embodiment, sensing circuits 208-1 and 208-2 may have different current sensing ranges abilities and/or different IR limits. With only sensing circuits 208-1 and 208-2 enabled ΣIR should equal the sum of replica currents IR-1 and IR-2, which in turn corresponds to a sum of load currents I-1 and I-2. Control system 210 may compare a predetermined value Threshold-1:2 to DS. If DS exceeds Threshold-1:2, then control system 210 can adjust operational aspects of one or both of subcircuits 202-1 and 202-2 via one or both of multibit control signals MBC-1 and MBC-2 to reduce current consumption. Alternatively, control system 210 can adjust operational aspects of one or more of the other subcircuits 202 (e.g., subcircuit 202-k) in order to reduce current consumed by the one or more other subcircuits. If Threshold-1:2 exceeds DS, the control system 210 may increase the load current consumed by subcircuits 202-1-202-k.

Figure 3:
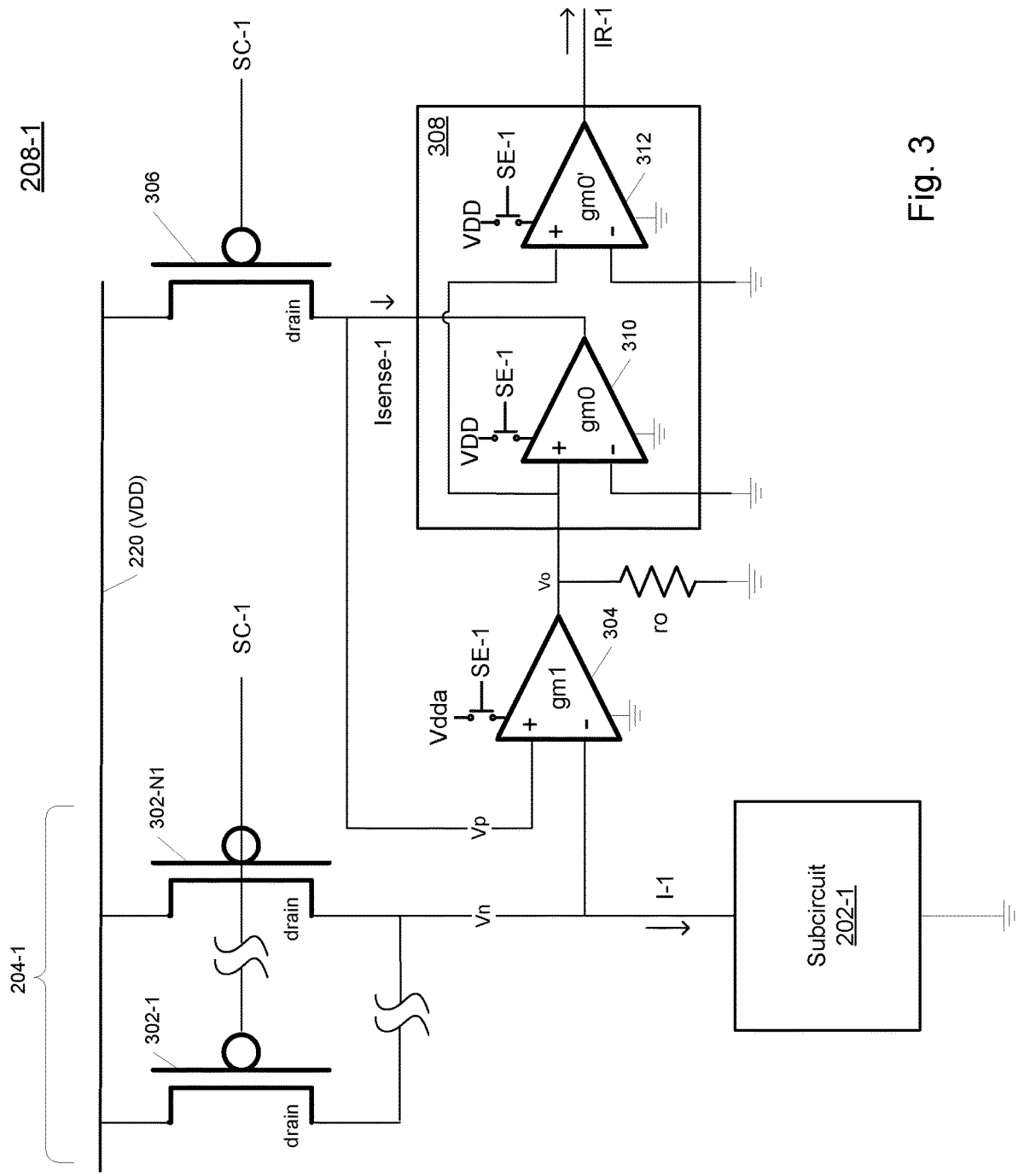
FIG. 3 is a schematic diagram that illustrates an example current sensing circuit employed in FIG. 2.

FIG. 3 is a schematic diagram of an example of sensing circuit 208-1 shown in FIG. 2. Sensing circuits 208-2-208-k can be similar or identical in structure to that shown in FIG. 3. Alternatively several sensing circuits 208 may differ in structure so that they have different current sensing ranges and/or IR limits. Sensing circuit 208-1 is coupled to switch 204-1 and subcircuit 202-1 (e.g., a DSP). In this embodiment, switch 204-1 takes form in N1, P-channel MOSFETs 302 with gates controlled by the same control signal SC-1, where N1 is an integer. Sensing circuit 208-1 includes a MOSFET 306 with a gate controlled by SC-1. In an alternative embodiment, MOSFET can be controlled by sense enable signal SE-1. However, the remaining disclosure will presume that MOSFET 306 is controlled by SC-1. The channel widths and lengths of MOSFETs 302 are presumed equal to the channel width and length of MOSFET 306, it being understood the present disclosure should not be limited thereto.

Sensing circuit 208-1 includes a high gain amplifier 304 having a transconductance gm1 and an ideal offset (i.e., Vos1=0V) Amplifier 304 has an inverting input coupled to subcircuit 202-1 and the drains of MOSFETs 302, and a noninverting input coupled to the drain of a MOSFET 306. The output of amplifier 304 is coupled to the input of a low voltage, transconductor and current copier (TCC) 308 and ground. An additional amplifier (not shown) could be inserted between amplifier 304 and TCC 308 to enhance gain in an alternative embodiment. Resistor r0 represents inherent resistance of the output of amplifier 304 to ground.

The combination of amplifier 304 and TCC 308 forces the drains of MOSFETs 302 and MOSFET 306 to approximately the same voltage. Since the gates of MOSFETs 302 and 306 are controlled by SC-1, and since MOSFETs 302 and 306 are presumed equal in size, current Isense-1 passed by activated MOSFET 306 should be close to if not identical to the current passing by each of the MOSFETs 302. In other words Isense-1 (I-1)/N1, so long as amplifier 304 has a high gain, and offset voltage Vos1=0V.

TCC 308 includes a pair of low voltage transconductance amplifiers 310 and 312 with transconductances gm0 and gm0', respectively, where gm0'=M1*gm0. In the embodiment shown, amplifiers 310 and 312 are powered by supply voltage VDD while amplifier 304 is powered by a different supply voltage Vdda. All amplifiers 304, 310, and 312 are connected to their respective supply voltages via respective switches, which are closed directly, or indirectly via a logic gate structure, when SE-1 is asserted. Sensing circuit 208-1 is deactivated when the switches are open. When SE-1 is asserted, an output voltage Vo of amplifier 304 is input to both noninverting inputs of amplifiers 310 and 312. Both inverting inputs of amplifiers 310 and 312 are grounded. The output of amplifier 310 is coupled to the drain of P-channel MOSFET 306. Amplifier 312 outputs replica current IR-1 to transducer 216 (not shown in FIG. 3). Since gm0'=M1*gm0, replica current IR-1 can be represented as IR-1=M1*(I-1)/N1.

As noted above, sensing circuits 208 may have different current sensing ranges or output IR limits. M1 and N1 are scaling factors that affect the current sensing ranges and/or IR limits. An increase in N1 increases the capability of switch 204-1 to pass load current. Since Isense-1=(I-1)/N1, an increase in N1 reduces Isense-1 proportionally for the same load current I-1. An increase in N1 leads to a reduction in Isense-1, which increases the current sensing range of sensing circuit 208-1 since a larger load current I-1 can be passed by switch 204-1 before Isense-1 reaches its saturation limit. Thus, a larger load current I-1 can be sensed when N1 is increased. A decrease in M1 will decrease the IR limit of current sensing circuit 208-1, and vice versa. To illustrate the foregoing principles, presume sensing circuit 208-1 has scaling factors N1=100 and M1=1, while sensing circuit 208-2 has scaling factors N2=200 and M2=1. Further presume that transducer 216 has a replica current capability limit of 0.5 mA. Due to the limitation of transducer 216, IR-1 and IR-2 should be limited to 0.5 mA. With IR-1=0.5 mA=M1*(I-1)/N1=1*(I-1)/100, then I-1=50 mA is the limit of sensing circuit 208-1's current sensing range. With IR-2=0.5 mA=M2*(I-2)/N2=1*(I-2)/200, then I-2=100 mA is the limit of sensing circuit 208-2's current sensing range. However, with these scaling factors, IR-1 and IR-2 cannot be summed at node 212 if I-1=50 mA and I-2=100 mA, since, ΣIR=IR-1+IR-2>0.5 mA, the replica current capability of transducer 216. Rather, I-1 and I-2 should be measured individually. However, if the transconductance ratios are changed to M1=0.3 and M2=0.6, for example, with N1=100, N2=200, I-1=50 mA, and I-2=100 mA, then IR-1=0.15 mA and IR-2=0.3 mA, and accordingly, IR-1 and IR-2 can be summed at node 212 since the summed current DR will be less than 0.5 mA, the limit of transducer 216's replica current capability. In one embodiment, control system 210 can adjust the transconductance ratios M for one or more sensing circuits 208 by reconfiguring amplifier 308. Transconductance ratios M for sensing circuits 208 that have unequal scaling factors N, can be adjusted so that the sensing circuits have convenient current sensing ranges, and as a result their replica currents, when summed, accurately measure the corresponding load currents I.

Figure 4:
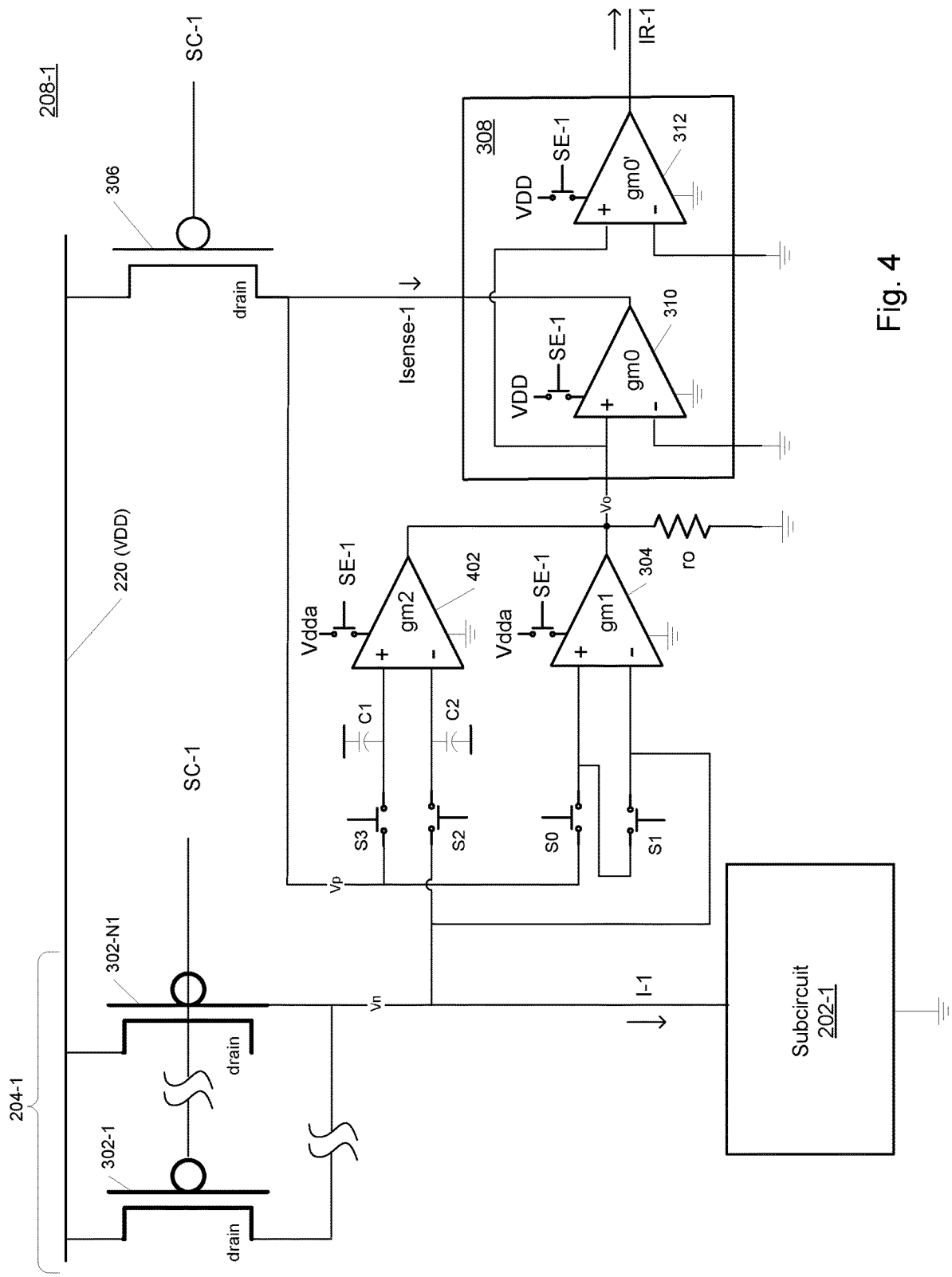
FIG. 4 is a schematic diagram that illustrates an example current sensing circuit employed in FIG. 2.

The output current IR-1 from TCC 308 is linearly dependent on current I-1 if the offset voltage of amplifier 304 is low (i.e., Vos1=0V). Otherwise, the dependence between current IR-1 and I-1 may not be linear. FIG. 4 illustrates the sensing circuit 208-1 of FIG. 3 with an amplifier 402 that is added to compensate for an amplifier 304 that has an offset voltage Vos1 high enough to affect linearity Amplifier 402 has a transconductance gm2, which differs from gm1. In addition the sensing circuit shown in FIG. 4 includes an array of switches S0-S3, which are coupled as shown to the inverting and noninverting inputs of amplifiers 402 and 304. Although not shown, switches S0-S3 can be controlled by control system 210. Holding capacitors C1 and C2 are connected between the inputs of amplifier 402 and a common voltage point (e.g., ground).

Sensing circuit 208-1 shown in FIG. 4 has two modes of operation. A calibration is performed in the first mode in which switches S1, S2, and S3 are closed while switch S0 is opened. Current I-1 should not be measured during the first mode. Capacitors C1 and C2 are charged in the first mode to hold a voltage difference between the drain voltages at MOSFET 306 and MOSFETS 302, respectively. This allows the effect of the non-zero voltage offset Vos1 of amplifier 304 to be sampled. Then sensing circuit 208-1 switches to the second mode, where switches S1-S3 are opened and switch S0 is closed. The voltage difference between capacitors C1 and C2 forces amplifier 402 to output a current that compensates for the current from amplifier 304 created by the non-zero offset voltage Vos1. Current I-1 can be measured in the second mode Importantly, the differential voltage held at capacitors C1 and C2 cancels the effect of the non-zero offset voltage Vos1 of amplifier 304, resulting in a more accurate current IR-1 at the output of TCC 308.

An integrated circuit (IC) in one embodiment includes a plurality of subcircuits, a plurality of power switches coupled to the plurality of subcircuits, respectively. The plurality of power switches can pass load currents to the plurality of subcircuits, respectively, when activated by a plurality of switch control signals, respectively. A plurality of sensing circuits are coupled to the plurality of subcircuits, respectively. The plurality of sensing circuits are configured to generate currents, respectively, that are proportional to the load currents, respectively. The IC also includes a node where the currents are aggregated to produce a summed current. The IC may also include a conversion circuit for converting the summed current into a multibit digital signal. The IC may also include a control circuit for selectively asserting the plurality of switch control signals based on the multibit digital signal. The control circuit may include a memory for storing instructions, a processor for executing the instructions. The processor can be configured to receive and process the multibit digital signal in response to executing the instructions. The IC of this embodiment may further include a first conductor for providing a first supply voltage, a second conductor for providing a second supply voltage that is different in magnitude from the first supply voltage. A first of the plurality of power switches can be coupled between the first conductor and a first of the plurality of subcircuits. A second of the plurality of power switches can be coupled between the second conductor and a second of the plurality of subcircuits. The plurality of power switches of the IC may include a first power switch that is controlled by a first control switch signal of the plurality of control signals, wherein the first power switch passes a first load current in response to an assertion of the first control switch signal. The plurality of sensing circuits may include a first sensing circuit, and the first sensing circuit may include a first sensing switch coupled to pass a first sensing current in response to the assertion of a first enable signal, a first amplifier with inputs coupled to a first subcircuit of the plurality of subcircuits and the first sensing switch, respectively, a first transconductor and current copier circuit configured to receive the first sensing current and an output of the first amplifier. The first transconductor and current copier circuit generates a first current of the currents based on the output of the first amplifier and the first sensing current.

An integrated circuit (IC) in another embodiment is formed on a substrate and includes a plurality of subcircuits, a plurality of sensing circuits coupled to the plurality of subcircuits, respectively. The plurality of something circuits are configured to generate a plurality of currents, respectively, that are proportional to a plurality of load currents, respectively, consumed by the plurality of subcircuits, respectively, during operation thereof. A circuit is coupled to the plurality of sensing circuits and configured to generate a signal based on an aggregate of the plurality of currents. The circuit may include a node for receiving the plurality of currents and for outputting a summed current that is the analog summation of the plurality of currents. The circuit may also include a transducer circuit for converting the summed current into an analog voltage signal with a magnitude that is proportional to a magnitude of the summed current. The circuit may further include a circuit for converting the analog voltage signal into a multibit digital signal. The IC in this embodiment may further include a control circuit for controlling one or more of the plurality of subcircuits based on the multibit digital signal. The control circuit may include a memory for storing instructions, and a processor for executing the instructions. The processor can generate a plurality of multibit control signals for controlling the plurality of subcircuits in response to processing the multibit digital signal according to the instructions. The IC may further include a plurality of power switches coupled to the plurality of subcircuits, respectively, wherein the plurality of power switches pass load currents to the plurality of subcircuits, respectively, when activated by a plurality of switch control signals, respectively, and a control circuit for generating one or more of the plurality of switch control signals based on the multibit digital signal. The plurality of sensing circuits may include a first sensing circuit, which includes a first sensing switch coupled to pass a first sensing current, a first amplifier comprising inputs coupled to a first subcircuit of the plurality of subcircuits and the first sensing switch, respectively, a first transconductor and current copier circuit configured to receive the first sensing current and an output of the first amplifier. The first transconductor and current copier circuit can generate a first current of the plurality of currents based on the output of the first amplifier and the first sensing current.

An integrated circuit (IC) in another embodiment is formed on a substrate, and includes a conductor for providing a supply voltage, a first subcircuit, a first power metal oxide field effect transistor (MOSFET) coupled between the conductor and the first subcircuit and configured to pass a first load current to the first subcircuit when activated, a first sensing circuit coupled to the first subcircuit and configured to generate a first current that is proportional to the first load current. The first sensing circuit includes a first sensing MOSFET coupled to the conductor and configured to pass a first sensing current when activated, a first amplifier comprising inputs coupled to the first sensing MOSFET and the first power MOSFET, a first circuit configured to receive the first sensing current and an output of the first amplifier, wherein the first circuit generates the first current based on the output of the first amplifier and the first sensing current. The first circuit may include second and third amplifiers, wherein non-inverting inputs of the second and third amplifiers are coupled to an output of the first amplifier; wherein inverting inputs of the second and third amplifiers are coupled to a ground node, wherein an output of the second amplifier is coupled to receive the first sensing current, and wherein an output of the third amplifier is configured to generate the first current. The first sensing current can be inversely proportional to N, where N is a ratio of the channel widths of the first power MOSFET and the first sensing MOSFET. The IC of this embodiment may further include a plurality of subcircuits including the first subcircuit, a plurality of power MOSFETs, including the first power MOSFET, coupled between the conductor and the plurality of subcircuits, respectively, and configured to pass respective load currents, including the first load current, to the plurality of subcircuits, respectively, when activated, a plurality of sensing circuits, including the first sensing circuit, configured to respectively pass sensing currents, including the first sensing circuit, when activated, and a circuit coupled to the plurality of sensing circuits and configured to generate a multibit signal based on an aggregate of the plurality of currents. The IC of this embodiment may further include a node where the currents are aggregated. The IC of this embodiment may further include a control circuit for generating a plurality of control signals for selectively activating the plurality of power MOSFETs, respectively, wherein the plurality of control signals are generated based on the multibit signal. The control circuit may include a memory for storing instructions; a processor for executing the instructions; wherein the processor is configured to generate the plurality of control in response to processing the multibit signal in accordance with the instructions.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. An integrated circuit (IC) comprising:
a plurality of subcircuits;
a plurality of power switches coupled to the plurality of subcircuits, respectively, wherein the plurality of power switches pass load currents to the plurality of subcircuits, respectively, when activated by a plurality of switch control signals, respectively;
a plurality of sensing circuits coupled to the plurality of subcircuits, respectively, wherein the plurality of sensing circuits are configured to generate currents, respectively, that are proportional to the load currents, respectively;
a node where the currents are aggregated to produce a summed current;
a first conductor for providing a first supply voltage;
a second conductor for providing a second supply voltage that is different in magnitude from the first supply voltage;
wherein a first of the plurality of power switches is coupled between the first conductor and a first of the plurality of subcircuits;
wherein a second of the plurality of power switches is coupled between the second conductor and a second of the plurality of subcircuits.

2. The IC of claim 1 further comprising a conversion circuit for converting the summed current into a multibit digital signal.

3. The IC of claim 2 further comprising a control circuit for selectively asserting the plurality of switch control signals based on the multibit digital signal.

4. The IC of claim 3 wherein the control circuit further comprises:
a memory for storing instructions;
a processor for executing the instructions;
wherein the processor is configured to receive and process the multibit digital signal in response to executing the instructions.

5. An integrated circuit (IC) comprising:
a plurality of subcircuits;
a plurality of power switches coupled to the plurality of subcircuits, respectively, wherein the plurality of power switches pass load currents to the plurality of subcircuits, respectively, when activated by a plurality of switch control signals, respectively;
a plurality of sensing circuits coupled to the plurality of subcircuits, respectively, wherein the plurality of sensing circuits are configured to generate currents, respectively, that are proportional to the load currents, respectively;
a node where the currents are aggregated to produce a summed current;
wherein the plurality of power switches comprises a first power switch that is controlled by a first control switch signal of the plurality of control signals, wherein the first power switch passes a first load current in response to an assertion of the first control switch signal;
wherein the plurality of sensing circuits comprises a first sensing circuit, and wherein the first sensing circuit comprises:
a first sensing switch coupled to pass a first sensing current in response to the assertion of a first enable signal;
a first amplifier comprising inputs coupled to a first subcircuit of the plurality of subcircuits and the first sensing switch, respectively;
a first transconductor and current copier circuit configured to receive the first sensing current and an output of the first amplifier, wherein the first transconductor and current copier circuit generates a first current of the currents based on the output of the first amplifier and the first sensing current.

6. An integrated circuit (IC) formed on a substrate, the IC comprising:
a plurality of subcircuits;
a plurality of sensing circuits coupled to the plurality of subcircuits, respectively, and configured to generate a plurality of currents, respectively, that are proportional to a plurality of load currents, respectively, consumed by the plurality of subcircuits, respectively, during operation thereof;
a circuit coupled to the plurality of sensing circuits and configured to generate a signal based on an aggregate of the plurality of currents;
a node for receiving the plurality of currents and outputting a summed current that is the analog summation of the plurality of currents;
a transducer circuit for converting the summed current into an analog voltage signal with a magnitude that is proportional to a magnitude of the summed current;
an circuit for converting the analog voltage signal into a multibit digital signal.

7. The IC of claim 6 further comprising a control circuit for controlling one or more of the plurality of subcircuits based on the multibit digital signal.

8. The IC of claim 7 wherein the control circuit further comprises:
a memory for storing instructions;
a processor for executing the instructions;
wherein the processor is configured to generate a plurality of multibit control signals for controlling the plurality of subcircuits in response to processing the multibit digital signal according to the instructions.

9. The IC of claim 6 further comprising:
a plurality of power switches coupled to the plurality of subcircuits, respectively, wherein the plurality of power switches pass load currents to the plurality of subcircuits, respectively, when activated by a plurality of switch control signals, respectively;
a control circuit for generating one or more of the plurality of switch control signals based on the multibit digital signal.

10. The IC of claim 9 wherein the control circuit further comprises:
a memory for storing instructions;
a processor for executing the instructions;
wherein the processor is configured to generate the plurality of control signals for controlling the plurality of power switches in response to processing the multibit signal in response to executing the instructions.

11. An integrated circuit (IC) formed on a substrate, the IC comprising:
a plurality of subcircuits;

a plurality of sensing circuits coupled to the plurality of subcircuits, respectively, and configured to generate a plurality of currents, respectively, that are proportional to a plurality of load currents, respectively, consumed by the plurality of subcircuits, respectively, during operation thereof;
a circuit coupled to the plurality of sensing circuits and configured to generate a signal based on an aggregate of the plurality of currents;
wherein the plurality of sensing circuits comprises a first sensing circuit, and wherein the first sensing circuit comprises:
  a first sensing switch coupled to pass a first sensing current;
  a first amplifier comprising inputs coupled to a first subcircuit of the plurality of subcircuits and the first sensing switch, respectively;
  a first transconductor and current copier circuit configured to receive the first sensing current and an output of the first amplifier, wherein the first transconductor and current copier circuit generates a first current of the plurality of currents based on the output of the first amplifier and the first sensing current.

12. An integrated circuit (IC) formed on a substrate, the IC comprising:
  a conductor for providing a supply voltage;
  a first subcircuit;
  a first power metal oxide field effect transistor (MOSFET) coupled between the conductor and the first subcircuit, and configured to pass a first load current to the first subcircuit when activated;
  a first sensing circuit coupled to the first subcircuit and configured to generate a first current that is proportional to the first load current;
  wherein the first sensing circuit comprises:
    a first sensing MOSFET coupled to the conductor and configured to pass a first sensing current when activated;
    a first amplifier comprising inputs coupled to the first sensing MOSFET and the first power MOSFET;
    a first circuit configured to receive the first sensing current and an output of the first amplifier, wherein the first circuit generates the first current based on the output of the first amplifier and the first sensing current.

13. The IC of claim 12 wherein the first circuit further comprises:
  second and third amplifiers;
  wherein non-inverting inputs of the second and third amplifiers are coupled to an output of the first amplifier;
  wherein inverting inputs of the second and third amplifiers are coupled to a ground node;
  wherein an output of the second amplifier is coupled to receive the first sensing current;
  wherein an output of the third amplifier is configured to generate the first current.

14. The IC of claim 12 wherein the first sensing current is inversely proportional to N, where N is a ratio of the channel widths of the first power MOSFET and the first sensing MOSFET.

15. The IC of claim 12 further comprising:
  a plurality of subcircuits including the first subcircuit;
  a plurality of power MOSFETs, including the first power MOSFET, coupled between the conductor and the plurality of subcircuits, respectively, and configured to pass respective load currents, including the first load current, to the plurality of subcircuits, respectively, when activated;
  a plurality of sensing circuits, including the first sensing circuit, configured to respectively pass sensing currents, including the first sensing circuit, when activated;
  a circuit coupled to the plurality of sensing circuits and configured to generate a multibit signal based on an aggregate of the plurality of currents.

16. The IC of claim 15 further comprising a node where the currents are aggregated.

17. The IC of claim 15 further comprising a control circuit for generating a plurality of control signals for selectively activating the plurality of power MOSFETs, respectively, wherein the plurality of control signals are generated based on the multibit signal.

18. The IC of claim 17 wherein the control circuit further comprises:
  a memory for storing instructions;
  a processor for executing the instructions;
  wherein the processor is configured to generate the plurality of control in response to processing the multibit signal in accordance with the instructions.

19. The IC of claim 5 further comprising a conversion circuit for converting the summed current into a multibit digital signal, and a control circuit for selectively asserting the plurality of switch control signals based on the multibit digital signal.

20. The IC of claim 19 wherein the control circuit further comprises:
  a memory for storing instructions;
  a processor for executing the instructions;
  wherein the processor is configured to receive and process the multibit digital signal in response to executing the instructions.

* * * * *